United States Patent
Kao

(10) Patent No.: US 12,487,622 B2
(45) Date of Patent: Dec. 2, 2025

(54) VOLTAGE REGULATOR AND SIGNAL AMPLIFYING CIRCUIT

(71) Applicant: Realtek Semiconductor Corporation, Hsinchu (TW)

(72) Inventor: Li-Lung Kao, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 288 days.

(21) Appl. No.: 18/193,652

(22) Filed: Mar. 31, 2023

(65) Prior Publication Data
US 2023/0350445 A1    Nov. 2, 2023

(30) Foreign Application Priority Data

Apr. 29, 2022 (TW) ................................. 111116557

(51) Int. Cl.
*G05F 1/575* (2006.01)
*H03F 3/45* (2006.01)

(52) U.S. Cl.
CPC .......... *G05F 1/575* (2013.01); *H03F 3/45179* (2013.01)

(58) Field of Classification Search
CPC ...... G05F 1/575; H03F 3/45179; H03F 3/451; H03F 2203/45166
See application file for complete search history.

(56) References Cited

U.S. PATENT DOCUMENTS

| | | | |
|---|---|---|---|
| 2006/0197513 A1* | 9/2006 | Tang | G05F 1/575 323/273 |
| 2007/0216381 A1* | 9/2007 | Tsuchiya | G05F 1/575 323/273 |

(Continued)

FOREIGN PATENT DOCUMENTS

| | | |
|---|---|---|
| CN | 1889001 A | 1/2007 |
| CN | 101609345 A | 12/2009 |

(Continued)

OTHER PUBLICATIONS

S.A.Z Murad et al., "Design of CMOS low-dropout voltage regulator for power management integrated circuit in 0.18-um technology," AIP Conference Proceedings, 2020. 2203. 020006. 10.1063/1.5142098.

(Continued)

*Primary Examiner* — Jue Zhang
*Assistant Examiner* — Jye-June Lee
(74) *Attorney, Agent, or Firm* — CKC & Partners Co., LLC

(57) ABSTRACT

A voltage regulator includes an error amplifier circuit, an output stage circuit and an output feedback path. The error amplifier circuit includes a first-stage amplifier and a second-stage amplifier. The first-stage amplifier is configured to amplify a difference between an output feedback signal and a reference signal to generate a first differential signal and a second differential signal. The second-stage amplifier is configured to amplify a difference between the first differential signal and the second differential signal to generate an output control signal. The output stage circuit is coupled with a first power terminal, and includes a switch. The switch is configured to generate an output signal at an output node according to the output control signal. The output feedback path is coupled with the output node and the error amplifier circuit, and is configured to generate the output feedback signal according to the output signal.

16 Claims, 9 Drawing Sheets

(56) References Cited

U.S. PATENT DOCUMENTS

| | | | |
|---|---|---|---|
| 2008/0068083 A1 | 3/2008 | Singh et al. | |
| 2008/0284513 A1* | 11/2008 | Chang | H03F 3/45659 330/258 |
| 2015/0349734 A1* | 12/2015 | Lee | H03F 3/45659 330/260 |
| 2019/0258282 A1* | 8/2019 | Magod Ramakrishna | G05F 1/575 |
| 2021/0320635 A1* | 10/2021 | Altan | G05F 1/575 |
| 2023/0117533 A1* | 4/2023 | Joo | H03F 3/45475 455/73 |

FOREIGN PATENT DOCUMENTS

| | | | | |
|---|---|---|---|---|
| CN | 206211950 U | * | 5/2017 | H03F 1/0205 |
| TW | 200643675 A | | 12/2006 | |
| TW | 200736875 A | | 10/2007 | |

OTHER PUBLICATIONS

J. Pérez-Bailón et al., "A power efficient LDO regulator for portable CMOS SoC measurement systems," 2017 IEEE International Instrumentation and Measurement Technology Conference (I2MTC), Turin, Italy, 2017, pp. 1-6, doi: 10.1109/I2MTC.2017.7969805.

H. Wang et al., "A CMOS Low-Dropout Regulator with A Dynamic-Biased Gain Stage," 2012 Far East Journal of Electronics and Communications. 7. 67-81.

Xiaofan Qiu, "Analysis and Characterization of a programmable Low-dropout regulator," Texas A&M University, Apr. 2007.

* cited by examiner

VOLTAGE REGULATOR AND SIGNAL AMPLIFYING CIRCUIT

RELATED APPLICATIONS

This application claims priority to Taiwan Application Serial Number 111116557, filed on Apr. 29, 2022, which is herein incorporated by reference in its entirety.

BACKGROUND

Technical Field

The present disclosure relates to a voltage regulator. More particularly, the present disclosure relates to a voltage regulator and a signal amplifying circuit mitigating the ringing.

Description of Related Art

The conventional linear regulator is composed of the error amplifier circuit, the power transistor and the feedback circuit. The error amplifier circuit controls the conduction degree of the power transistor, according to the comparison result between the feedback signal and the reference signal, so as to generate a stable output voltage. In the conventional linear regulator, the error amplifier circuit generally has transistors with quite large sizes to reduce noises, but this design causes significant parasitic elements and reduces the phase margin. Therefore, the output voltage is prone to ringing when the loading varies and a long stabilizing time is needed. Today's electronic devices, however, are developed toward the direction of high speed and high resolution to satisfy the requirements of high-quality communication and video and audio streaming. The conventional voltage regulator cannot satisfy the requirements of today's circuit designs.

SUMMARY

The disclosure provides a voltage regulator including an error amplifier circuit, an output stage circuit and an output feedback path. The error amplifier circuit includes a first-stage amplifier and a second-stage amplifier. The first-stage amplifier is configured to amplify a difference between an output feedback signal and a reference signal to generate a first differential signal and a second differential signal. The second-stage amplifier is configured to amplify a difference between the first differential signal and the second differential signal to generate an output control signal. The output stage circuit is coupled with a first power terminal, and includes a switch. The switch is configured to generate an output signal at an output node according to the output control signal. The output feedback path is coupled with the output node and the error amplifier circuit, and is configured to generate the output feedback signal according to the output signal.

The disclosure provides a signal amplifying circuit including an error amplifier circuit and an output stage circuit. The error amplifier circuit includes a first-stage amplifier and a second-stage amplifier. The first-stage amplifier is configured to amplify a difference between a first input signal and a second input signal to generate a first differential signal and a second differential signal. The second-stage amplifier is configured to amplify a difference between the first differential signal and the second differential signal to generate an output control signal. The output stage circuit is coupled with a first power terminal, and includes a switch. The switch is configured to generate an output signal at an output node according to the output control signal.

It is to be understood that both the foregoing general description and the following detailed description are by examples, and are intended to provide further explanation of the disclosure as claimed.

DETAILED DESCRIPTION

Figure 1A:
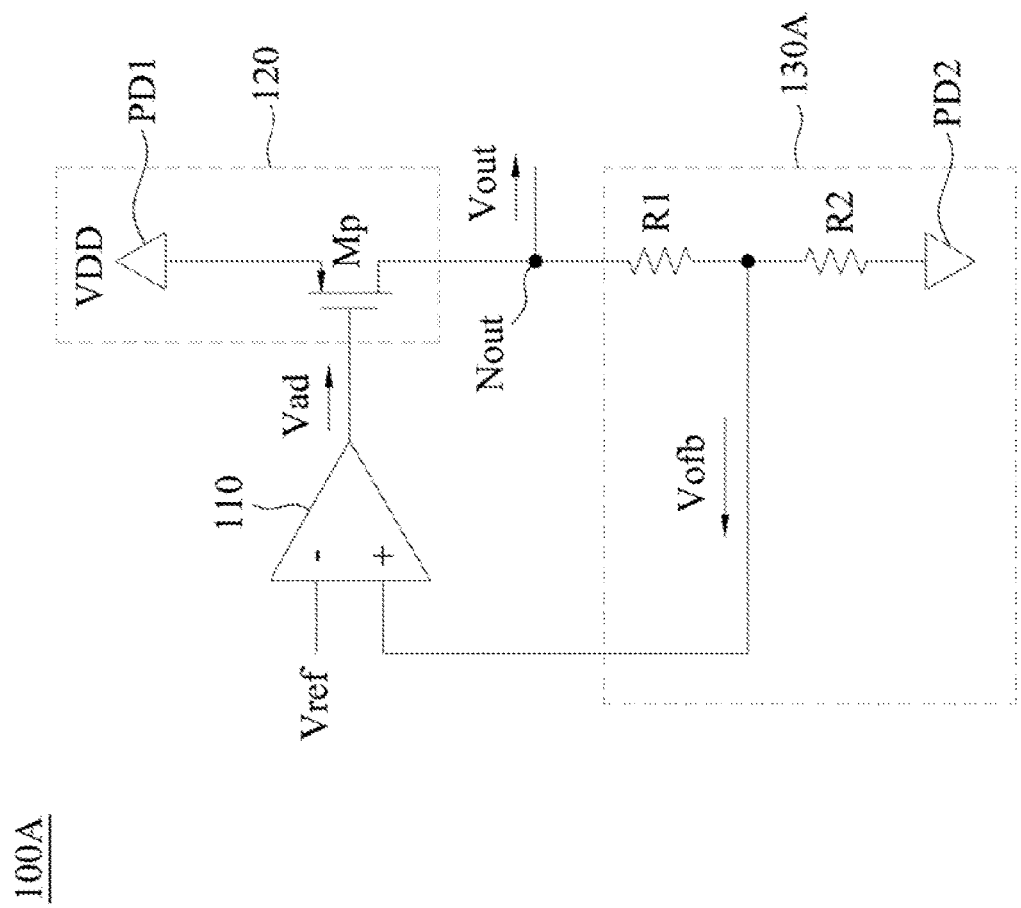
FIG. 1A is a functional block diagram of a voltage regulator according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1A is a functional block diagram of a voltage regulator 100A according to one embodiment of the present disclosure. The voltage regulator 100A comprises an error amplifier circuit 110, an output stage circuit 120 and an output feedback path 130A. The error amplifier circuit 110 is configured to compare an output feedback signal Vofb and a reference signal Vref, and to generate an output control signal Vad according to a difference between the output feedback signal Vofb and the reference signal Vref. In one embodiment, the error amplifier circuit 110 receives the reference signal Vref by an inverting input terminal thereof, and receives the output feedback signal Vofb by a non-inverting input terminal thereof. The output stage circuit 120 is coupled between a first power terminal PD1 and an output node Nout. The output stage circuit 120 is configured to convert an input power VDD of the first power terminal PD1 according to the output control signal Vad, so as to provide an output signal Vout at the output node Nout. In addition, the output feedback path 130A is coupled between the output node Nout and a second power terminal PD2 (e.g., the ground terminal), and coupled with the error amplifier circuit 110 (e.g., the non-inverting input terminal). The output feedback path 130A is configured to generate the output feedback signal Vofb according to the output signal Vout. In some embodiments, the voltage regulator 100A can be implemented as a low-dropout regulator (LDO regulator).

The output stage circuit 120 comprises a switch Mp coupled between the first power terminal PD1 and the output node Nout, and a control terminal of the switch Mp is configured to receive the output control signal Vad. The output control signal Vad is configured to control the conduction degree of the switch Mp, so as to convert the input power VDD into the output signal Vout. In this embodiment, the switch Mp may be implemented using a P-type power metal-oxide-semiconductor (MOS) field-effect transistor.

In some embodiments, the output feedback path 130A is a voltage dividing circuit, and comprises voltage dividing resistors R1 and R2 coupled in series. The voltage dividing resistors R1 and R2 are configured to perform voltage division to the output signal Vout to generate the output feedback signal Vofb.

Figure 1B:
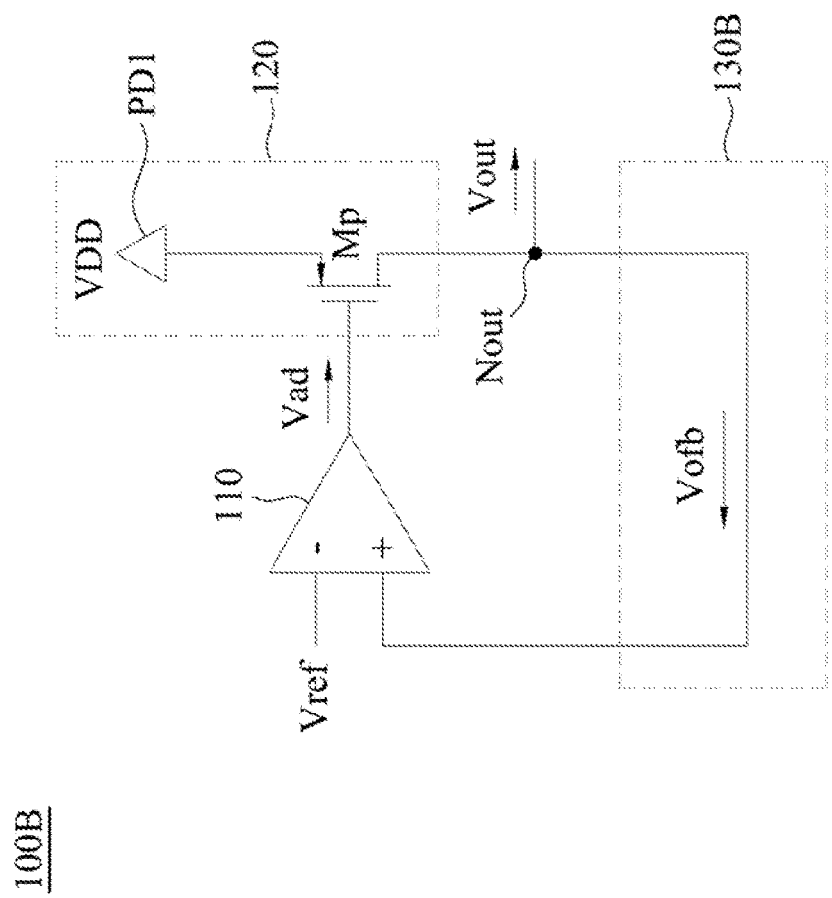
FIG. 1B is a functional block diagram of a voltage regulator according to one embodiment of the present disclosure.

FIG. 1B is a functional block diagram of a voltage regulator 100B according to one embodiment of the present disclosure. The voltage regulator 100B is similar to the voltage regulator 100A of FIG. 1A and only their differences are described herein. The voltage regulator 100B comprises an error amplifier circuit 110, an output stage circuit 120 and an output feedback path 130B. The output feedback path 130B is coupled with the output node Nout and the error amplifier circuit 110 (e.g., the non-inverting input terminal). The output feedback path 130B is configured to transmit the output signal Vout to the error amplifier circuit 110 as the output feedback signal Vofb. In some embodiments, the output feedback path 130B is a metal wire coupled between the output node Nout and the error amplifier circuit 110 (e.g., the non-inverting input terminal). In some embodiments, the voltage regulator 100B can be implemented as the LDO regulator.

Figure 2:
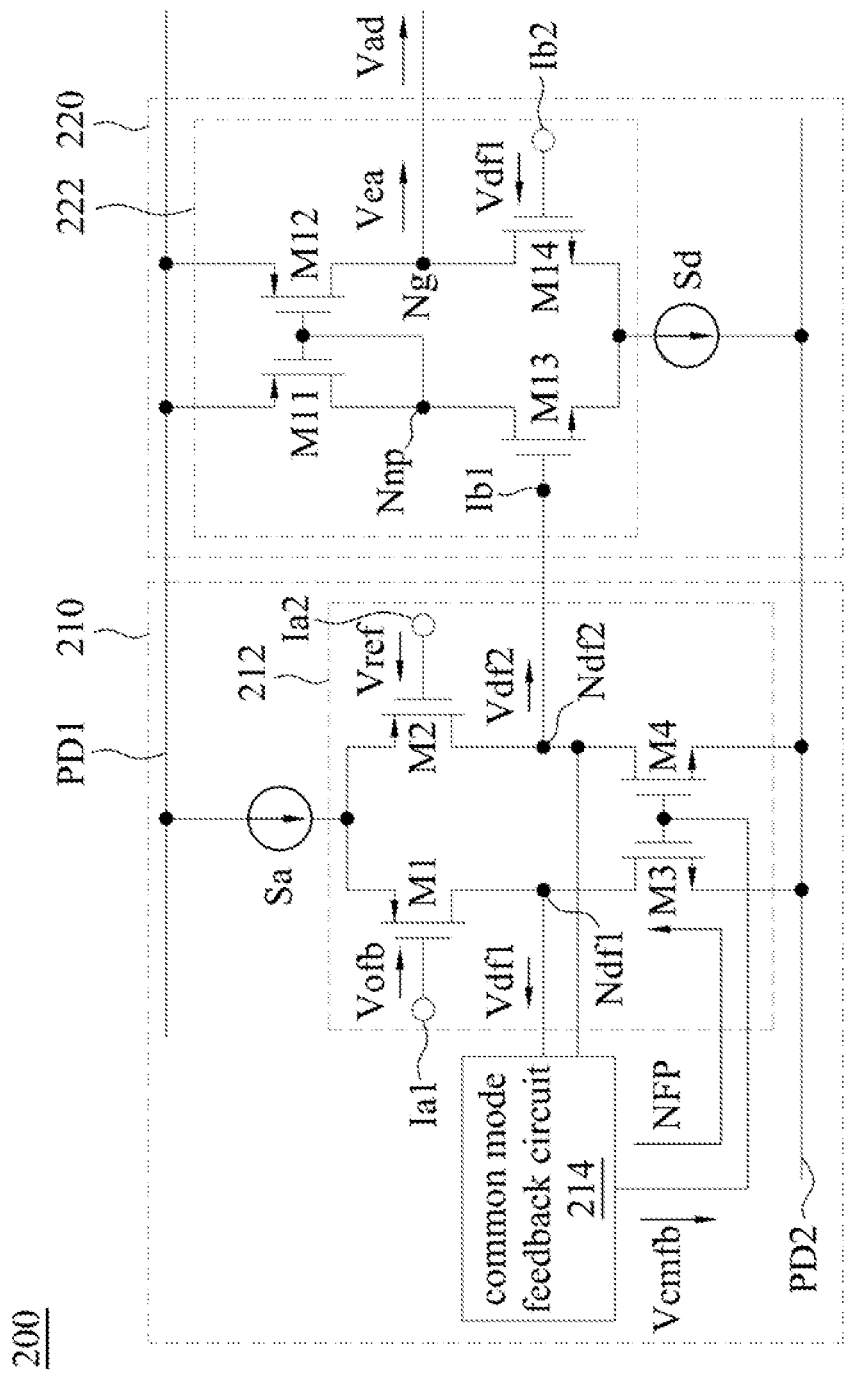
FIG. 2 is a schematic diagram of an error amplifier circuit according to one embodiment of the present disclosure.

FIG. 2 is a schematic diagram of an error amplifier circuit 200 according to one embodiment of the present disclosure. The error amplifier circuit 200 can be used to implement the error amplifier circuits 110 of FIG. 1A and FIG. 1B. The error amplifier circuit 200 comprises a first-stage amplifier 210 and a second-stage amplifier 220. The first-stage amplifier 210 comprises a first input terminal Ia1 (e.g., the non-inverting input terminal) configured to receive the output feedback signal Vofb, and comprises a second input terminal Ia2 (e.g., the inverting input terminal) is configured to receive the reference signal Vref. The first-stage amplifier 210 is configured to amplify the difference between the output feedback signal Vofb and the reference signal Vref, so as to generate the first differential signal Vdf1 and the second differential signal Vdf2, that is, the first-stage amplifier 210 is a fully differential amplifier. On the other hand, the second-stage amplifier 220 comprises a first input terminal Ib1 (e.g., the non-inverting input terminal) configured to receive the second differential signal Vdf2, and comprises a second input terminal Ib2 (e.g., the inverting input terminal) configured to receive the first differential signal Vdf1. The second-stage amplifier 220 is configured to amplify a difference between the first differential signal Vdf1 and the second differential signal Vdf2, so as to generate an error amplifying signal Vea, that is, the second-stage amplifier 220 is a differential to single-ended amplifier. In one embodiment, the error amplifying signal Vea is outputted to the output stage circuit 120 as the output control signal Vad.

The circuit structure and operations of the first-stage amplifier 210 are described in the following. The first-stage amplifier 210 comprises a first current source Sa, a fully differential amplifier circuit 212 and a common mode feedback circuit 214. The first current source Sa is coupled with the first power terminal PD1. The fully differential amplifier circuit 212 is coupled between the first current source Sa and the second power terminal PD2. The fully differential amplifier circuit 212 is configured to amplify the difference between the output feedback signal Vofb and the reference signal Vref, so as to output the first differential signal Vdf1 and the second differential signal Vdf2 at the first differential node Ndf1 and the second differential node Ndf2, respectively. The common mode feedback circuit 214 is coupled with the first differential node Ndf1 and the second differential node Ndf2, and is configured to provide the common mode feedback signal Vcmfb to the fully differential amplifier circuit 212, according to the first differential signal Vdf1 and the second differential signal Vdf2. The common mode feedback signal Vcmfb is for controlling the conduction degree of the transistors of the fully differential amplifier circuit 212, so as to stabilize a direct-current (DC) common mode voltage of the first differential signal Vdf1 and the second differential signal Vdf2.

For example, when the DC common mode voltage of the first differential signal Vdf1 and the second differential signal Vdf2 increases, the common mode feedback signal Vcmfb makes the fully differential amplifier circuit 212 reduce the DC common mode voltage, and vice versa. In other words, the common mode feedback circuit 214 and the fully differential amplifier circuit 212 form a voltage negative feedback path NFP.

In one embodiment, the fully differential amplifier circuit 212 comprises a first transistor M1, a second transistor M2, a third transistor M3 and a fourth transistor M4. The first transistor M1 is coupled between the first current source Sa and the first differential node Ndf1, and a control terminal of the first transistor M1 is configured to receive the output feedback signal Vofb, so that the first transistor M1 generates the first differential signal Vdf1 at the first differential node Ndf1 under the control of the output feedback signal Vofb. The second transistor M2 is coupled between the first current source Sa and the second differential node Ndf2, and a control terminal of the second transistor M2 is configured to receive the reference signal Vref, so that the second transistor M2 generates the second differential signal Vdf2 at the second differential node Ndf2 under the control of the reference signal Vref. The third transistor M3 is coupled between the first differential node Ndf1 and the second power terminal PD2. The fourth transistor M4 is coupled between the second differential node Ndf2 and the second power terminal PD2. A control terminal of the third transistor M3 and a control terminal of the fourth transistor M4 are configured to receive the common mode feedback signal Vcmfb. In other words, the common mode feedback signal Vcmfb is configured to control the conduction degree of the third transistor M3 and the fourth transistor M4 to stabilize the aforesaid DC common mode voltage.

In one embodiment, the first transistor M1 and the second transistor M2 may be a differential input pair implemented using P-type MOS field-effect transistors. The third transistor M3 and the fourth transistor M4 may be implemented using N-type MOS field-effect transistors.

Figure 3:
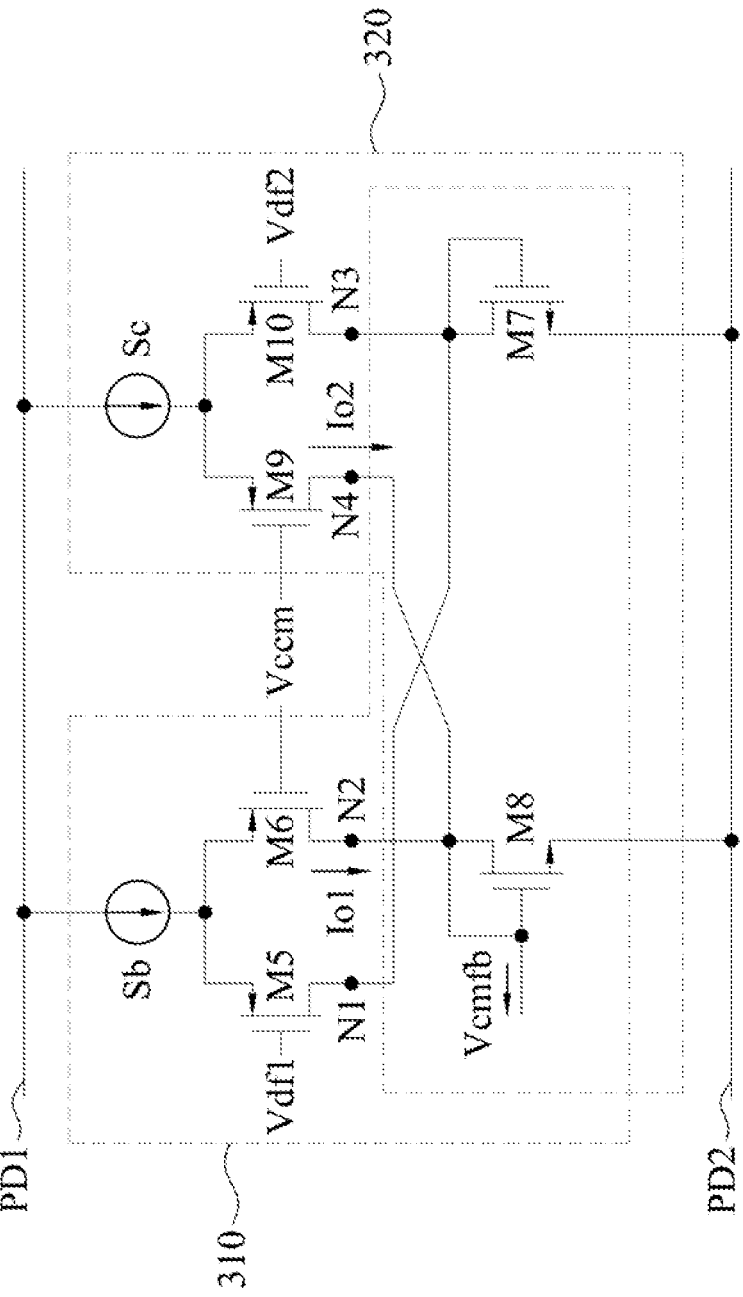
FIG. 3 is a schematic diagram of a common mode feedback circuit according to one embodiment of the present disclosure.

Reference is made to FIG. 3, in which FIG. 3 is a schematic diagram of a common mode feedback circuit 214 according to one embodiment of the present disclosure. In this embodiment, the common mode feedback circuit 214 is configured to compare each of the first differential signal Vdf1 and the second differential signal Vdf2 with the common mode control signal Vccm, and generates the common mode feedback signal Vcmfb according to the comparison result. The common mode feedback circuit 214 comprises a first amplifier circuit 310 and a second amplifier circuit 320. The first amplifier circuit 310 comprises a first input terminal and a second input terminal configured to receive the common mode control signal Vccm and the first differential signal Vdf1, respectively. The first amplifier circuit 310 is configured to amplify a difference between the first differential signal Vdf1 and the common mode control signal Vccm to generate a first output current Io1. The second amplifier circuit 320 comprises a first input terminal and a second input terminal configured to receive the second differential signal Vdf2 and the common mode control signal Vccm, respectively. The second amplifier circuit 320 is configured to amplify a difference between the second differential signal Vdf2 and the common mode control signal Vccm to generate a second output current Io2. The common mode feedback circuit 214 is configured to generate the common mode feedback signal Vcmfb according to the first output current Io1 and the second output current Io2.

In structure, the first amplifier circuit 310 comprises a second current source Sb, a fifth transistor M5, a sixth transistor M6, a seventh transistor M7 and an eighth transistor M8. The second current source Sb is coupled with the first power terminal PD1. The fifth transistor M5 is coupled between the second current source Sb and a first node N1, and a control terminal of the fifth transistor M5 is configured to receive the first differential signal Vdf1. The sixth transistor M6 is coupled between the second current source Sb and a second node N2, and configured to provide the first output current Io1 to the second node N2. A control terminal of the sixth transistor M6 is configured to receive the common mode control signal Vccm. The seventh transistor M7 comprises a first terminal and a control terminal coupled with the first node N1 and a third node N3, and a second terminal of the seventh transistor M7 is coupled with the second power terminal PD2. The eighth transistor M8 comprises a first terminal and a second terminal coupled with the second node N2 and a fourth node N4, and a second terminal of the eighth transistor M8 is coupled with the second power terminal PD2.

The second amplifier circuit 320 comprises a third current source Sc, the seventh transistor M7, the eighth transistor M8, a ninth transistor M9 and a tenth transistor M10. The third current source Sc is coupled with the first power terminal PD1. The ninth transistor M9 is coupled between the third current source Sc and the fourth node N4, and configured to provide the second output current Io2 to the fourth node N4. A control terminal of the ninth transistor M9 is configured to receive the common mode control signal Vccm. The tenth transistor M10 is coupled between the third current source Sc and the third node N3, and a control terminal of the tenth transistor M10 is configured to receive the second differential signal Vdf2.

Through the diode-connected structure, the eighth transistor M8 converts the first output current Io1 and the second output current Io2 into the common mode feedback signal Vcmfb at the control terminal thereof. In one embodiment, the control terminal of the eighth transistor M8 is coupled with the control terminal of the third transistor M3 and the control terminal of the fourth transistor M4 of FIG. 2.

In some embodiments, the fifth transistor M5, the sixth transistor M6, the ninth transistor M9 and the tenth transistor M10 may be implemented using P-type MOS field-effect transistors. The seventh transistor M7 and the eighth transistor M8 may be implemented using N-type MOS field-effect transistors. In one embodiment, the eighth transistor M8 may be replaced by a resistor coupled between the second node N2 and the second power terminal PD2.

In operation, when the DC common mode voltage of the first differential signal Vdf1 and the second differential signal Vdf2 is higher than the common mode control signal Vccm, the first output current Io1 and the second output current Io2 increase accordingly. Therefore, the voltage of the common mode feedback signal Vcmfb increases and the conduction degree of the third transistor M3 and the fourth transistor M4 of FIG. 2 increases, thereby reducing the DC common mode voltage. By contrast, when the DC common mode voltage of the first differential signal Vdf1 and the second differential signal Vdf2 is lower than the common mode control signal Vccm, the voltage of the common mode feedback signal Vcmfb reduces to increase the DC common mode voltage.

Reference is made to FIG. 2 again. The circuit structure and operation of the second-stage amplifier 220 are described in the following. The second-stage amplifier 220 comprises a fourth current source Sd and a differential to single-ended amplifier 222. The fourth current source Sd is coupled between the differential to single-ended amplifier 222 and the second power terminal PD2. The differential to single-ended amplifier 222 is coupled with the first power terminal PD1, and configured to amplify the difference between the first differential signal Vdf1 and the second differential signal Vdf2 to output the error amplifying signal Vea.

In structure, the differential to single-ended amplifier 222 comprises an eleventh transistor M11 and a twelfth transistor M12 forming a current mirror, and also comprises a thirteenth transistor M13 and a fourteenth transistor M14 forming a differential input pair. The eleventh transistor M11 is coupled between the first power terminal PD1 and an inverting node Nnp, and a control terminal of the eleventh transistor M11 is also coupled with the inverting node Nnp. The twelfth transistor M12 is coupled between the first power terminal PD1 and a gain node Ng, and a control terminal of the twelfth transistor M12 is coupled with the inverting node Nnp. The gain node Ng is configured to provide the error amplifying signal Vea as the output control signal Vad. The thirteenth transistor M13 is coupled between the inverting node Nnp and the fourth current source Sd, and a control terminal of the thirteenth transistor M13 is configured to receive the second differential signal Vdf2. The fourteenth transistor M14 is coupled between the gain node Ng and the fourth current source Sd, and a control terminal of the fourteenth transistor M14 is configured to receive the first differential signal Vdf1. In some embodiments, the current mirror of the differential to single-ended amplifier 222 may be replaced by a current mirror of other category such as cascode current mirror. The person of ordinary skill in the art will appreciate such replacement under the teachings of the present disclosure.

In some voltage regulators that the first-stage amplifier of the error amplifier circuit comprises the current mirror, the transistors of the first-stage amplifier are designed to have relatively larger sizes (or width-length ratios) to reduce noises, because of the relatively greater contribution of the first-stage amplifier to the noises. However, the current mirror with large size has significant parasitic elements and therefore such configuration reduces the phase margin of the voltage regulator so that the output voltage of the voltage regulator is prone to ringing.

By contrast, the current mirror (the eleventh transistor M11 and the twelfth transistor M12) of the error amplifier circuit 200 of FIG. 2 is arranged in the second-stage amplifier 220. The second-stage amplifier 220 has the contribution to the input-referred noise far less than that of the first-stage amplifier 210. Therefore, even the transistors of the second-stage amplifier 220 are designed to be fairly small the noises do not increase accordingly. As such, the size of the current mirror can be reduced to reduce the parasitic elements, which helps to improve the phase margins of the voltage regulator 100A of FIG. 1A and the voltage regulator 100B of FIG. 1B to suppress the ringing.

Figure 4:
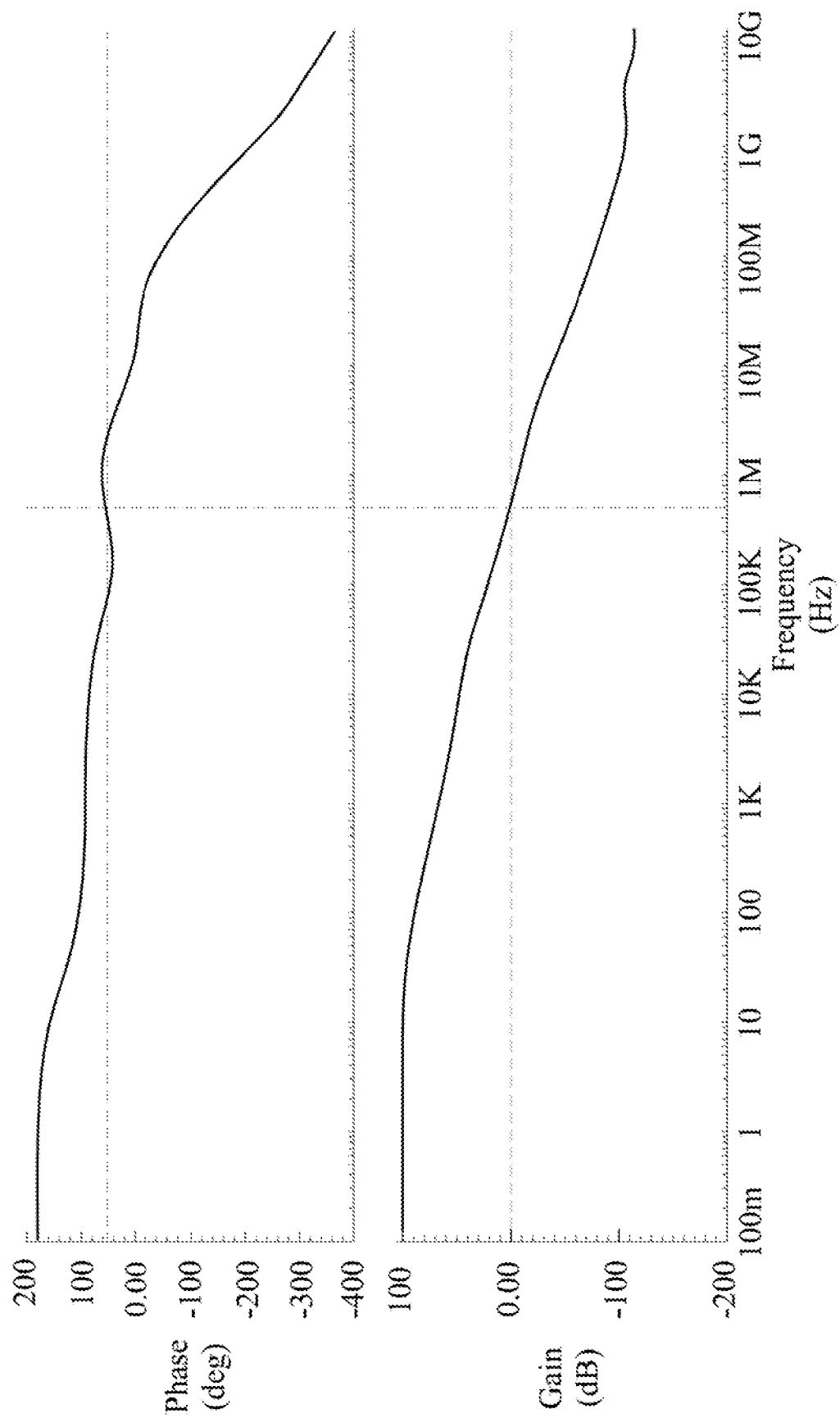
FIG. 4 shows frequency response curves of a conventional voltage regulator.
Figure 5:
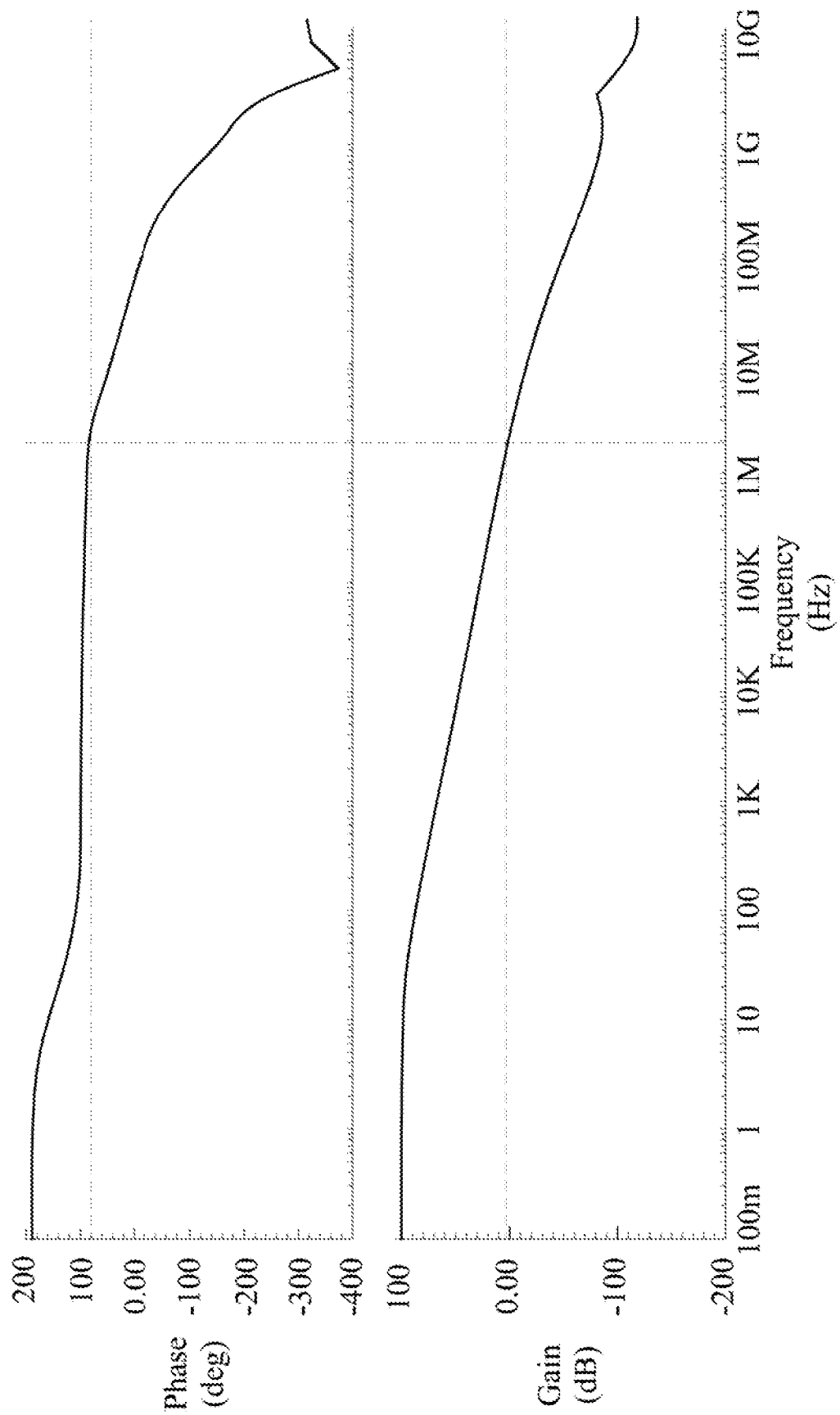
FIG. 5 shows frequency response curves of the voltage regulator according to one embodiment of the present disclosure.

FIG. 4 shows frequency response curves of a conventional voltage regulator, which corresponds to the voltage regulator with the current mirror arranged in the first-stage amplifier. FIG. 5 shows frequency response curves of the voltage regulator 100A according to one embodiment of the present disclosure. The definition of the phase margin is the difference between the phase of the output signal and −180°, at the 0 dB gain. The phase margin of the embodiment of FIG. 4 is approximately 230°, while the phase margin of the embodiment of FIG. 5 is approximately 260°. Therefore, the voltage regulator 100A has the phase margin increased by approximately 30° compared with the prior arts. Similar to those described above for the voltage regulator 100A, the voltage regulator 100B of FIG. 1B also has the advantage of wide phase margin, and the detailed descriptions thereof are omitted herein, for the sake of brevity.

Figure 6:
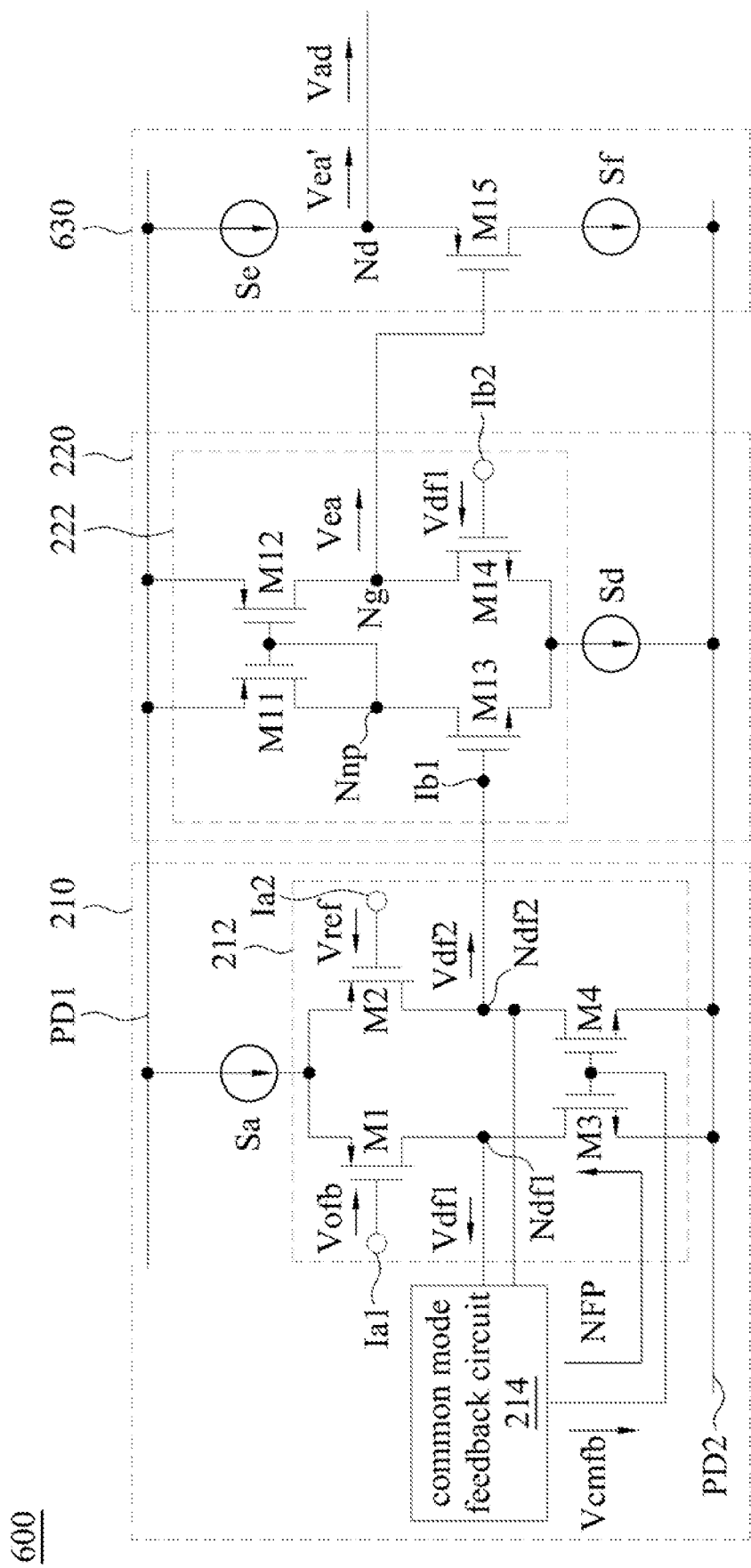
FIG. 6 is a schematic diagram of an error amplifier circuit according to one embodiment of the present disclosure.

FIG. 6 is a schematic diagram of an error amplifier circuit 600 according to one embodiment of the present disclosure. The error amplifier circuit 600 can be used to implement the error amplifier circuits 110 of FIG. 1A and FIG. 1B, and comprises the first-stage amplifier 210, the second-stage amplifier 220 and a buffer circuit 630. The first-stage amplifier 210 and the second-stage amplifier 220 have circuit structures and operations similar to those described above with reference to FIG. 2 and FIG. 3, and the detailed descriptions thereof are omitted herein, for the sake of brevity.

The buffer circuit 630 is coupled with the gain node Ng, and configured to adjust the error amplifying signal Vea to generate an adjusted error amplifying signal Vea'. In one embodiment, the adjustment may be that the buffer circuit 630 applies a unit gain or a greater gain to the error amplifying signal Vea. In this situation, the adjusted error amplifying signal Vea' is provided to the output stage circuits 120 of FIG. 1A and FIG. 1B as the output control signal Vad. In structure, the buffer circuit 630 comprises a fifteenth transistor M15, a fifth current source Se and a sixth current source Sf. The fifth current source Se is coupled between the first power terminal PD1 and the driving node Nd, in which the driving node Nd is configured to provide the adjusted error amplifying signal Vea'. The sixth current source Sf is coupled with the second power terminal PD2. The fifteenth transistor M15 is coupled between the driving node Nd and the sixth current source Sf, and a control terminal of the fifteenth transistor M15 is configured to receive the error amplifying signal Vea. In some embodiments, the fifteenth transistor M15 may be implemented using a P-type MOS field-effect transistor.

It is worth mentioning that the buffer circuit 630 moves the poles in the frequency response curves of the voltage regulators 100A and 100B further towards higher frequencies, thereby helping further improve the phase margins of the voltage regulators 100A and 100B.

Figure 7:
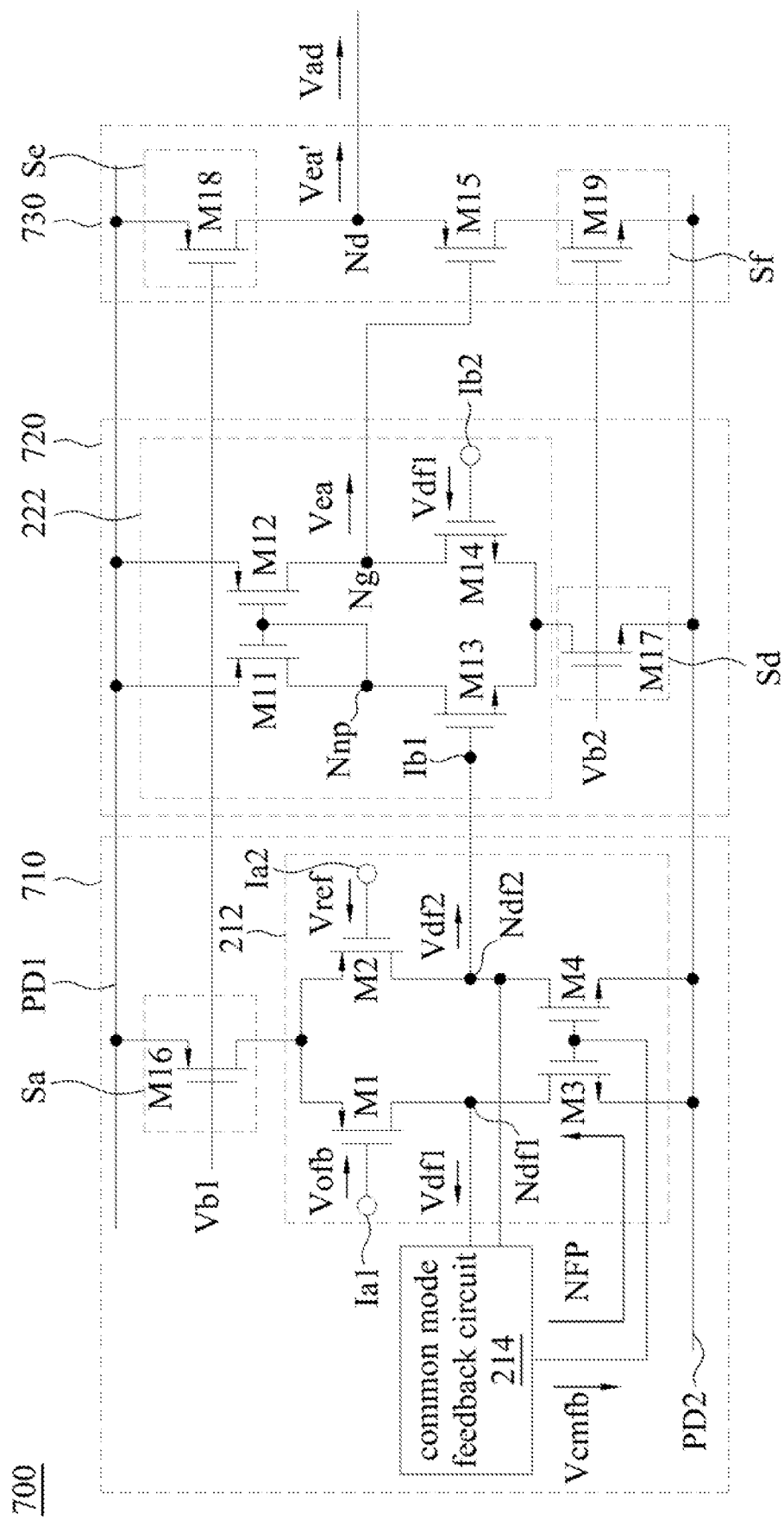
FIG. 7 is a schematic diagram of an error amplifier circuit according to one embodiment of the present disclosure.

FIG. 7 is a schematic diagram of an error amplifier circuit 700 according to one embodiment of the present disclosure. The error amplifier circuit 700 can be used to realize the error amplifier circuits 110 of FIG. 1A and FIG. 1B, and comprises a first-stage amplifier 710, a second-stage amplifier 720 and a buffer circuit 730. The first-stage amplifier 710 is similar to the first-stage amplifier 210 of FIG. 2, the difference is that the first current source Sa of the first-stage amplifier 710 comprises a sixteenth transistor M16 coupled between the first power terminal PD1 and the fully differential amplifier circuit 212. The second-stage amplifier 720 is similar to the second-stage amplifier 220 of FIG. 2, the difference is that the fourth current source Sd of the second-stage amplifier 720 comprises a seventeenth transistor M17 coupled between the differential to single-ended amplifier 222 and the second power terminal PD2. The buffer circuit 730 is similar to the buffer circuit 630 of FIG. 6, the difference is that the fifth current source Se and the sixth current source Sf of the buffer circuit 730 respectively comprise an eighteenth transistor M18 and a nineteenth transistor M19. The eighteenth transistor M18 is coupled between the first power terminal PD1 and the driving node Nd. The nineteenth transistor M19 is coupled between the fifteenth transistor M15 and the second power terminal PD2. In some embodiments, a control terminal of the sixteenth transistor M16 and a control terminal of the eighteenth transistor M18 are configured to receive the same first bias signal Vb1, and a control terminal of the seventeenth transistor M17 and a control terminal of the nineteenth transistor M19 are configured to receive the same second bias signal Vb2.

In some embodiments, the sixteenth transistor M16 and the eighteenth transistor M18 may be implemented using the P-type MOS field-effect transistors, and the seventeenth transistor M17 and the nineteenth transistor M19 may be implemented using the N-type MOS field-effect transistors.

Figure 8:
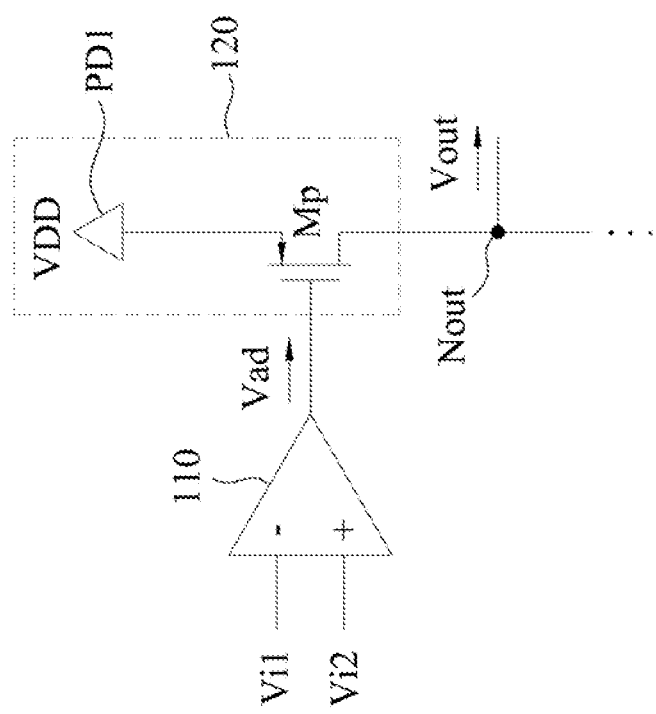
FIG. 8 is a functional block diagram of a signal amplifying circuit according to one embodiment of the present disclosure.

FIG. 8 is a functional block diagram of a signal amplifying circuit 800 according to one embodiment of the present disclosure. The signal amplifying circuit 800 is a general purpose signal amplifying circuit, and comprises an error amplifier circuit 110 and an output stage circuit 120. The error amplifier circuit 110 is configured to amplify the difference between the first input signal Vi1 and the second input signal Vi2 to generate the output control signal Vad. The output stage circuit 120 is coupled between the first power terminal PD1 and the output node Nout, and is configured to convert the input power VDD of the first power terminal PD1 according to the output control signal Vad, so as to provide the output signal Vout at the output node Nout. The output stage circuit 120 comprises the switch Mp coupled between the first power terminal PD1 and the output node Nout, and a control terminal of the switch Mp is configured to receive the output control signal Vad. The error amplifier circuit 110 of FIG. 8 may be implemented using the error amplifier circuit 200 of FIG. 2, the error amplifier circuit 600 of FIG. 6 or the error amplifier circuit 700 of FIG. 7. In this situation, the first input terminal Ia1 and the second input terminal Ia2 of the first-stage amplifier (e.g., the first-stage amplifier 210 or 710) are configured to respectively receive the first input signal Vi1 and the second input signal Vi2. Other corresponding components, connection relationships and operations of the error amplifier circuit 110 of FIG. 8 are similar to those described above with reference to FIG. 2, FIG. 6 or FIG. 7, and the detailed descriptions thereof are omitted herein, for the sake of brevity.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling"

herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A voltage regulator, comprising:
   an error amplifier circuit, comprising:
   a first-stage amplifier, comprising:
      a first current source, coupled with a first power terminal;
      a fully differential amplifier circuit, coupled between the first current source and a second power terminal, and configured to amplify a difference between an output feedback signal and a reference signal to generate a first differential signal and a second differential signal; and
      a common mode feedback circuit, configured to provide a common mode feedback signal to the fully differential amplifier circuit so as to stabilize a direct-current common mode voltage of the first differential signal and the second differential signal, wherein the common mode feedback circuit comprises:
         a first amplifier circuit, configured to amplify a difference between the first differential signal and a common mode control signal to generate a first output current; and
         a second amplifier circuit, configured to amplify a difference between the second differential signal and the common mode control signal to generate a second output current,
         wherein the common mode feedback circuit is configured to generate the common mode feedback signal according to the first output current and the second output current;
   a second-stage amplifier, configured to amplify a difference between the first differential signal and the second differential signal to generate an output control signal;
   an output stage circuit, coupled with the first power terminal and comprising a switch, wherein the switch is configured to generate an output signal at an output node according to the output control signal; and
   an output feedback path, coupled with the output node and the error amplifier circuit, and configured to generate the output feedback signal according to the output signal.

2. The voltage regulator of claim 1, wherein the fully differential amplifier circuit comprises:
   a first transistor, coupled between the first current source and a first differential node, and controlled by the output feedback signal to generate the first differential signal at the first differential node;
   a second transistor, coupled between the first current source and a second differential node, and controlled by the reference signal to generate the second differential signal at the second differential node;
   a third transistor, coupled between the first differential node and the second power terminal, and controlled by the common mode feedback signal; and
   a fourth transistor, coupled between the second differential node and the second power terminal, and controlled by the common mode feedback signal.

3. The voltage regulator of claim 1, wherein the first amplifier circuit comprises:
   a second current source, coupled with the first power terminal;
   a fifth transistor, coupled between the second current source and a first node, and controlled by the first differential signal;
   a sixth transistor, coupled between the second current source and a second node, and controlled by the common mode control signal to provide the first output current to the second node;
   a seventh transistor, wherein a first terminal and a control terminal of the seventh transistor are coupled with the first node and a third node, and a second terminal of the seventh transistor is coupled with the second power terminal; and
   an eighth transistor, wherein a first terminal and a control terminal of the eighth transistor are coupled with the second node and a fourth node, and a second terminal of the eighth transistor is coupled with the second power terminal,
   wherein the second amplifier circuit comprises:
   a third current source, coupled with the first power terminal;
   the seventh transistor;
   the eighth transistor;
   a ninth transistor, coupled between the third current source and the fourth node, and controlled by the common mode control signal to provide the second output current to the fourth node; and
   a tenth transistor, coupled between the third current source and the third node, and controlled by the second differential signal.

4. The voltage regulator of claim 1, wherein the second-stage amplifier comprises:
   a differential to single-ended amplifier, coupled with the first power terminal, and configured to amplify the difference between the first differential signal and the second differential signal to output an error amplifying signal, wherein the voltage regulator generates the output control signal according to the error amplifying signal; and
   a fourth current source, coupled between the differential to single-ended amplifier and the second power terminal.

5. The voltage regulator of claim 4, wherein the differential to single-ended amplifier comprises:
   an eleventh transistor, coupled between the first power terminal and an inverting node;
   a twelfth transistor, coupled between the first power terminal and a gain node, wherein the gain node is configured to provide the error amplifying signal, and a control terminal of the eleventh transistor and a control terminal of the twelfth transistor are coupled with the inverting node;

a thirteenth transistor, coupled between the inverting node and the fourth current source, and controlled by the second differential signal; and a fourteenth transistor, coupled between the gain node and the fourth current source, and controlled by the first differential signal.

6. The voltage regulator of claim 4, wherein the error amplifier circuit further comprises a buffer circuit, and the buffer circuit comprises:

a fifth current source, coupled between the first power terminal and a driving node;

a sixth current source, coupled with the second power terminal; and a fifteenth transistor, coupled between the driving node and the sixth current source, and controlled by the error amplifying signal to provide an adjusted error amplifying signal at the driving node as the output control signal.

7. The voltage regulator of claim 6, wherein the first current source comprises a sixteenth transistor coupled between the first power terminal and the fully differential amplifier circuit, the fourth current source comprises a seventeenth transistor coupled between the differential to single-ended amplifier and the second power terminal, the fifth current source comprises an eighteenth transistor coupled between the first power terminal and the driving node, the sixth current source comprises a nineteenth transistor coupled between the fifteenth transistor and the second power terminal, wherein a control terminal of the sixteenth transistor and a control terminal of the eighteenth transistor are configured to receive a first bias signal, and a control terminal of the seventeenth transistor and a control terminal of the nineteenth transistor are configured to receive a second bias signal.

8. The voltage regulator of claim 1, wherein the output feedback path comprises:

a first voltage dividing resistor, configured to receive the output signal; and a second voltage dividing resistor, coupled with the first voltage dividing resistor in series, wherein the first voltage dividing resistor and the second voltage dividing resistor are configured to perform voltage division to the output signal to generate the output feedback signal.

9. The voltage regulator of claim 1, wherein the output feedback path is configured to transmit the output signal to the error amplifier circuit as the output feedback signal.

10. A signal amplifying circuit, comprising:
an error amplifier circuit, comprising:
a first-stage amplifier, comprising:
a first current source, coupled with a first power terminal;
a fully differential amplifier circuit, coupled between the first current source and a second power terminal, and configured to amplify a difference between a first input signal and a second input signal to generate a first differential signal and a second differential signal; and
a common mode feedback circuit, configured to provide a common mode feedback signal to the fully differential amplifier circuit so as to stabilize a direct-current common mode voltage of the first differential signal and the second differential signal, wherein the common mode feedback circuit comprises:
a first amplifier circuit, configured to amplify a difference between the first differential signal and a common mode control signal to generate a first output current; and
a second amplifier circuit, configured to amplify a difference between the second differential signal and the common mode control signal to generate a second output current;
wherein the common mode feedback circuit is configured to generate the common mode feedback signal according to the first output current and the second output current;
a second-stage amplifier, configured to amplify a difference between the first differential signal and the second differential signal to generate an output control signal; and
an output stage circuit, coupled with the first power terminal and comprising a switch, wherein the switch is configured to generate an output signal at an output node according to the output control signal.

11. The signal amplifying circuit of claim 10, wherein the fully differential amplifier circuit comprises:

a first transistor, coupled between the first current source and a first differential node, and controlled by the first input signal to generate the first differential signal at the first differential node;

a second transistor, coupled between the first current source and a second differential node, and controlled by the second input signal to generate the second differential signal at the second differential node;

a third transistor, coupled between the first differential node and the second power terminal, and controlled by the common mode feedback signal; and a fourth transistor, coupled between the second differential node and the second power terminal, and controlled by the common mode feedback signal.

12. The signal amplifying circuit of claim 10, wherein the first amplifier circuit comprises:

a second current source, coupled with the first power terminal;

a fifth transistor, coupled between the second current source and a first node, and controlled by the first differential signal;

a sixth transistor, coupled between the second current source and a second node, and controlled by the common mode control signal to provide the first output current to the second node;

a seventh transistor, wherein a first terminal and a control terminal of the seventh transistor are coupled with the first node and a third node, and a second terminal of the seventh transistor is coupled with the second power terminal; and an eighth transistor, wherein a first terminal and a control terminal of the eighth transistor are coupled with the second node and a fourth node, and a second terminal of the eighth transistor is coupled with the second power terminal, wherein the second amplifier circuit comprises:
a third current source, coupled with the first power terminal;
the seventh transistor;
the eighth transistor;

a ninth transistor, coupled between the third current source and the fourth node, and controlled by the common mode control signal to provide the second output current to the fourth node; and a tenth transistor, coupled between the third current source and the third node, and controlled by the second differential signal.

13. The signal amplifying circuit of claim 10, wherein the second-stage amplifier comprises:

a differential to single-ended amplifier, coupled with the first power terminal, and configured to amplify the difference between the first differential signal and the second differential signal to output an error amplifying signal, wherein the signal amplifying circuit generates the output control signal according to the error amplifying signal; and a fourth current source, coupled between the differential to single-ended amplifier and the second power terminal.

14. The signal amplifying circuit of claim 13, wherein the differential to single-ended amplifier comprises:

an eleventh transistor, coupled between the first power terminal and an inverting node;

a twelfth transistor, coupled between the first power terminal and a gain node, wherein the gain node is configured to provide the error amplifying signal, and a control terminal of the eleventh transistor and a control terminal of the twelfth transistor are coupled with the inverting node;

a thirteenth transistor, coupled between the inverting node and the fourth current source, and controlled by the second differential signal; and a fourteenth transistor, coupled between the gain node and the fourth current source, and controlled by the first differential signal.

15. The signal amplifying circuit of claim 13, wherein the error amplifier circuit further comprises a buffer circuit, and the buffer circuit comprises:

a fifth current source, coupled between the first power terminal and a driving node;

a sixth current source, coupled with the second power terminal; and a fifteenth transistor, coupled between the driving node and the sixth current source, and controlled by the error amplifying signal to provide an adjusted error amplifying signal at the driving node as the output control signal.

16. The signal amplifying circuit of claim 15, wherein the first current source comprises a sixteenth transistor coupled between the first power terminal and the fully differential amplifier circuit, the fourth current source comprises a seventeenth transistor coupled between the differential to single-ended amplifier and the second power terminal, the fifth current source comprises an eighteenth transistor coupled between the first power terminal and the driving node, the sixth current source comprises a nineteenth transistor coupled between the fifteenth transistor and the second power terminal, wherein a control terminal of the sixteenth transistor and a control terminal of the eighteenth transistor are configured to receive a first bias signal, and a control terminal of the seventeenth transistor and a control terminal of the nineteenth transistor are configured to receive a second bias signal.

* * * * *